United States Patent [19]
Carter

[11] Patent Number: 5,481,433
[45] Date of Patent: Jan. 2, 1996

[54] HEAT DISSIPATION FROM HIGH POWER SEMICONDUCTORS IN AN ELECTRICAL VEHICLE

[75] Inventor: James C. Carter, Clarkston, Mich.

[73] Assignee: Chrysler Corporation, Highland Park, Mich.

[21] Appl. No.: 266,348

[22] Filed: Jul. 1, 1994

[51] Int. Cl.[6] ................................................ H05K 7/20
[52] U.S. Cl. ...................... 361/690; 165/80.2; 165/80.3; 165/185; 174/16.3; 361/704
[58] Field of Search ..................... 165/80.2, 80.3, 165/185; 361/687, 688, 690–697, 704; 244/1 R; 454/184

[56] References Cited

U.S. PATENT DOCUMENTS

| | | | |
|---|---|---|---|
| 2,902,597 | 9/1959 | Leidy et al. | 361/695 |
| 3,451,469 | 6/1969 | Hall et al. | 165/41 |
| 3,965,971 | 6/1976 | Roggenkamp | 165/39 |
| 3,973,477 | 8/1976 | Jakob et al. | 454/184 |
| 4,331,209 | 5/1982 | Bauer et al. | 180/54 |
| 4,364,444 | 12/1982 | Donato et al. | 180/65 R |
| 4,674,704 | 6/1987 | Altoz et al. | 361/690 |
| 4,772,759 | 9/1988 | Roy et al. | 361/692 |
| 5,297,005 | 3/1994 | Gourdine | 361/695 |
| 5,375,655 | 12/1994 | Lee | 361/690 |

OTHER PUBLICATIONS

Research Disclosure "An Enhancement of Heat Sink Using Air Collector and Duct", Oct. 1991, No. 330, Kenneth March Publichations Ltd, England.

Primary Examiner—Gregory D. Thompson
Attorney, Agent, or Firm—Margaret A. Dobrowitsky

[57] ABSTRACT

A heat exchanger constructed of convoluted fins, a large funnel-shaped opening for air intake and an opening for air exhaust can be efficiently used to dissipate heat generated by high powered semiconductors in an electric vehicle through the use of ram air.

8 Claims, 1 Drawing Sheet

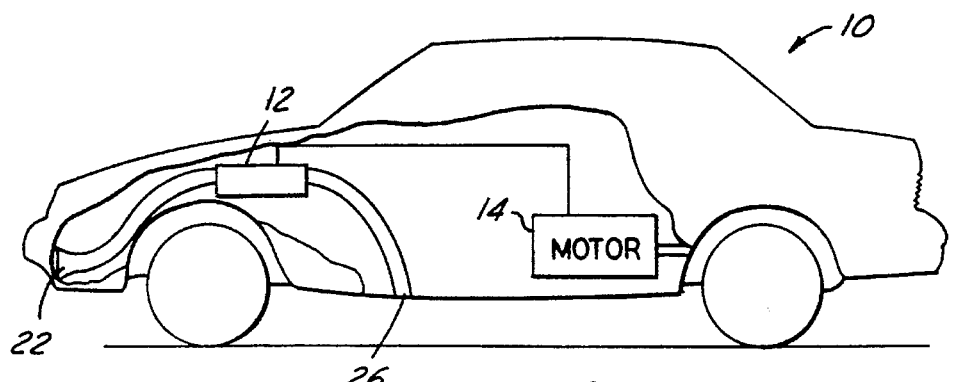
FIG. 1
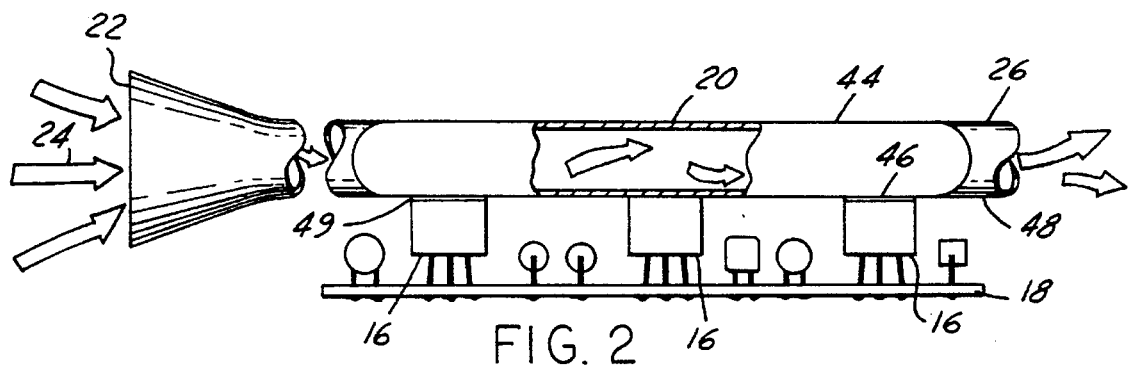
FIG. 2
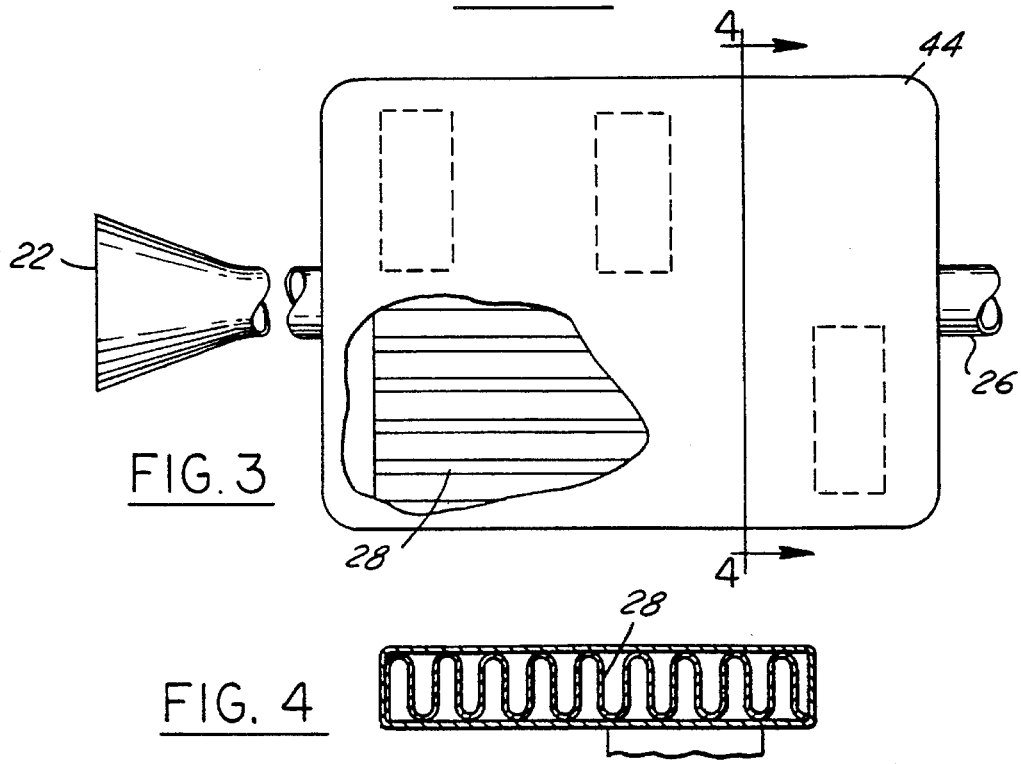
FIG. 3
FIG. 4

HEAT DISSIPATION FROM HIGH POWER SEMICONDUCTORS IN AN ELECTRICAL VEHICLE

FIELD OF THE INVENTION

The present invention generally relates to a device for dissipating heat from semiconductors in an electric vehicle and more particularly, relates to a device for dissipating heat from high power semiconductors in an electric vehicle utilizing a convoluted fin heat exchanger attached to the semiconductors and ram air.

BACKGROUND OF THE INVENTION

In the design of electric vehicles, high power semiconductors are frequently used for motor control. These high power semiconductors include switching devices such as IGBT's (integrated gate bipolar transistors) or FET's (field effect transistors). During the normal operation of an electric vehicle, between 500–1000 watts of heat is generated. This heat must be removed from the semiconductors in order to prevent damages to the semiconductors from occuring and to allow them to function properly.

Typically, a natural convection heat sink is used in automobiles to remove heat generated by semiconductors. However, it has been found that in the case of an electric vehicle, standard natural convection and even forced convection heat sinks are inadequate. For instance, one electric vehicle application uses a forced convection heat sink by utilizing several muffin fans for increased air flow. Even with this arrangement, full motor drive is time limited due to the excessive heat generated by the semiconductors. Moreover, besides the disadvantage of having to use a very large heat sink and muffin fans, the vehicle efficiency suffers due to the running fans and the additional weight as indicative by the miles achieved per battery charge.

Others have also proposed solutions for the semiconductor heating problem, for instance, the use of liquid cooled coldplates. However, the use of liquid cooled coldplates generates other problems such as the requirements of maintaining a liquid flow, piping, a reservoir and a liquid-to-air heat exchanger (i.e. a radiator). These additional equipment not only adds complexity to the cooling system, but also adds costs, weight and thus decrease the vehicle operating efficiency. For instance, U.S. Pat. No. 3,965,971 issued to Roggencamp discloses a cooling system for semiconductors, specifically, silicon controlled rectifiers. The rectifiers are liquid cooled by a closed circuit cooling system utilizing an osculating pump, a heat exchanging reservoir, and a rectifier mounting block. The rectifier mounting block forms a fluid chamber for ease of heat exchange. The Roggencamp device therefore required large equipment expenses and complex equipment setup.

It is therefor an object of the present invention to provide a device for dissipating heat from high power semiconductors in an electric vehicle that does not have the drawbacks of the prior art methods.

It is another object of the present invention to provide a device for dissipating heat from high power semiconductors in an electric vehicle by using a convoluted fin heat exchanger.

It is a further object of the present invention to provide a device for dissipating heat from high power semiconductors in an electric vehicle by using a convoluted fin heat exchanger and high volume ram air.

It is yet another object of the present invention to provide a device for dissipating heat from high power semiconductors in an electric vehicle by using a convoluted fin heat exchanger and a minimum air flow of 30 CFM.

It is still another object of the present invention to provide a device for dissipating heat from high power semiconductors in an electric vehicle by using a convoluted fin heat exchanger equipped with a funnel-shaped opening for the intake of large volume ram air.

SUMMARY OF THE INVENTION

In accordance with the present invention, a device for dissipating heat from high power semiconductors used in an electric vehicle is provided.

In the preferred embodiment, a heat exchanger constructed of convoluted fins, a large funnel-shaped opening for air intake and an opening for air exhaust is provided. The convoluted fins are arranged in a box-like container which is in intimate thermal contact with the high powered semiconductors. In a typical application, 800 watts of heat generated by the high power semiconductors can be efficiency dissipated by a heat exchanger having a top and a bottom surface each having an area of 67 $in^2$ that contains convoluted fins therein at an air flow rate of approximately 45 CFM.

The present invention provides an efficient cooling method for high powered semiconductors without the need for equipment to contain a liquid coolant and to cause the circulation of such liquid coolant.

BRIEF DESCRIPTION OF THE DRAWINGS

Other objects, features and advantages of the present invention will become apparent upon consideration of the specification and the appended drawings, in which:

FIG. 1 is a partial cross-sectional view of an electric vehicle.

FIG. 2 is a side view of the heat dissipating device and a semiconductor circuit board.

FIG. 3 is a top view of the heat dissipating device with the convoluted fins partially exposed.

FIG. 4 is an enlarged cross-sectional view of the convoluted fins taken along line 4—4 in FIG. 3.

DETAILED DESCRIPTION OF THE PREFERRED EMBODIMENT

The present invention provides a modified air-to-air heat exchanger (air-cooled plate) utilizing ram air generated by a moving vehicle. Heat exchangers manufactured from convoluted fin stock have a much lower thermal resistance than conventional heat exchangers. The thermal resistance of a heat exchanger depends on the shape of the plate, the type of the fin stock (e.g. fin height, pitch, and density) and the volume of the air flow. The present invention provides a unique application of a convoluted fin heat exchanger in an electric vehicle to dissipate heat generated by high power semiconductors by using high volume ram air generated by a moving vehicle itself. The design of the heat exchanger further incorporates a unique funnel-shaped opening to allow a large volume air intake.

Referring initially to FIG. 1, wherein a partial cross-sectional view of an electric vehicle 10 is shown. The electric vehicle 10 is powered by motor 14 which is controlled by an electric controller 12. The electrical controller 12 is cooled by ram air taken in from the funnel-shaped air intake opening 22. The air exhausts at air outlet 26.

FIG. 2 shows a side view of an electric controller 12 including high power semiconductors 16 that are attached at one end to circuit board 18. High power semiconductors 16 are in intimate thermal contact at another end with convoluted fin heat exchanger 20 which has an air intake 22 to accept ram air 24 from outside of vehicle 10, and an exhaust port 26 where the air is exhausted. A suitable ram air flow rate for the present invention is between about 5 to 50 CFM, a more suitable range is between about 10 to about 45 CFM.

FIG. 3 is a top view of the convoluted heat exchanger 20 partially exposing the convoluted fins. The dashed lines show the location of the high power semiconductors 16 that are in intimate contact with the bottom surface 48 of the convoluted heat exchanger 20. The top surfaces 46 of semiconductors 16 are in intimate thermal contact with the bottom surface 48 of the convoluted fin heat exchanger by using a high thermal conductance adhesive 49. Adhesives such as those filled with metal powder can be used to promote heat conductance.

FIG. 4 shows an enlarged cross-sectional view of convoluted fins through section 4—4 of FIG. 3. The convoluted fin heat exchanger 20 includes fins 28 which extend from the bottom surface 48 of heat exchanger 20 to the top surface 44. The fins 28 have an average height of 0.375 in, an average thickness of 0.006 in and a fin pitch of approximately 19 fins/in. Any other suitable dimensions of the fins should work equally well in the present invention. The fins 28 are generally made of a high thermal conductance material. One of such suitable materials for use in the present invention is copper. By using a special convoluted configuration of the fins 28, the surface area of the fins that contacts the top surface 44 and the bottom surface 48 of the heat exchanger 20 can be maximized such that the cooling capacity of intake ram air 24 can be utilized to its maximum extent.

While the present invention has been described in an illustrative manner, it should be understood that the terminology used is intended to be in a nature of words of description rather than of limitation.

Furthermore, while the present invention has been described in terms of a preferred embodiment thereof, it is to be appreciated that those skilled in the art will readily apply these teachings to other possible variations of the invention, for instance, other suitable configurations of the convoluted fin or the heat exchanger may provide equally satisfactory results of cooling for the high powered semiconductors.

The embodiments of the invention in which an exclusive property or privilege is claimed are defined as follows:

1. An electric powered vehicle comprising:

an electric motor that provides a motive force for propelling the vehicle along a surface;

a plurality of high powered semiconductors for controlling said electric motor;

heat exchanger device for cooling said high powered semiconductors including a generally box-like container having a top surface and a bottom surface;

a generally funnel-shaped air intake that carries moving air due to movement of the vehicle and has one end coupled to one end of said box-like container;

an air exhaust opening at an opposite end of said box-like container;

at least one convoluted fin situated in said box-like container having a large surface area in intimate contact with said top surface and said bottom surface of said container, said at least one convoluted fin being arranged in a configuration that provides an air flow passage between said air intake and said air exhaust opening; and wherein at least one of said bottom and top surfaces is coupled to said high powered semiconductors.

2. A vehicle according to claim 1, wherein said fins are made of a high thermal conductance material.

3. A vehicle according to claim 1, wherein said fins are made of metal.

4. A vehicle according to claim 3, wherein said fins are made of copper.

5. A vehicle according to claim 1, wherein said fins have an average thickness of no more than 0.100 inches.

6. A vehicle according to claim 1, wherein said at least one of said top and bottom surfaces of said box-like container is adhesively coupled to said high powered semiconductors by an adhesive.

7. A vehicle according to claim 6, wherein said adhesive is a metal particle filled adhesive having high thermal conductance.

8. A vehicle according to claim 1, wherein said air intake is configured to carry a minimal air flow of 10 CFM.

\* \* \* \* \*